(12) United States Patent
Kwon (10) Patent No.: US 11,038,475 B2
(45) Date of Patent: Jun. 15, 2021

(54) LOW-POWER, LOW-NOISE AMPLIFIER WITH NEGATIVE FEEDBACK LOOP

(71) Applicant: KNU-Industry Cooperation Foundation, Chuncheon-si (KR)

(72) Inventor: Ku Duck Kwon, Seoul (KR)

(73) Assignee: KNU-INDUSTRY COOPERATION FOUNDATION, Gangwon-Do (KR)

( * ) Notice: Subject to any disclaimer, the term of this patent is extended or adjusted under 35 U.S.C. 154(b) by 19 days.

(21) Appl. No.: 16/684,431

(22) Filed: Nov. 14, 2019

(65) Prior Publication Data

US 2021/0152135 A1    May 20, 2021

(51) Int. Cl.
| | |
|---|---|
| H03F 3/16 | (2006.01) |
| H03F 1/34 | (2006.01) |
| H03F 3/50 | (2006.01) |
| H03F 3/45 | (2006.01) |
| H03F 1/22 | (2006.01) |
| H03F 3/04 | (2006.01) |
| H03F 3/19 | (2006.01) |

(52) U.S. Cl.
CPC ......... *H03F 1/342* (2013.01); *H03F 3/45766* (2013.01); *H03F 3/505* (2013.01); *H03F 1/22* (2013.01); *H03F 1/223* (2013.01); *H03F 3/04* (2013.01); *H03F 3/19* (2013.01); *H03F 3/45179* (2013.01)

(58) Field of Classification Search
CPC ...... H03F 1/342; H03F 3/505; H03F 3/45766; H03F 3/1935; H03F 3/193; H03F 2200/372; H03F 2200/294; H03F 3/45475; H03F 3/28; H03F 3/36; H03F 1/50

USPC .......................... 330/117, 277, 301
See application file for complete search history.

(56) References Cited

U.S. PATENT DOCUMENTS

| | | | | |
|---|---|---|---|---|
| 6,417,737 | B1 * | 7/2002 | Moloudi | H03B 21/01 |
| | | | | 330/301 |
| 7,263,342 | B2 * | 8/2007 | Bagheri | H03F 3/193 |
| | | | | 455/283 |

(Continued)

FOREIGN PATENT DOCUMENTS

| | | |
|---|---|---|
| KR | 100856443 B1 | 9/2008 |
| KR | 100904669 B1 | 6/2009 |

OTHER PUBLICATIONS

Cruz, Hugo et al., "A 1.3 mW Low-IF, Current-Reuse, and Current-Bleeding RF Front-End for the MICS Band With Sensitivity of -97 dBM", IEEE Transactions on Circuits and Systems—I: Regular Papers, Jun. 2015, vol. 62, No. 2, pp. 1627-1636.

*Primary Examiner* — Khanh V Nguyen
(74) *Attorney, Agent, or Firm* — Holzer Patel Drennan (57) ABSTRACT

A low-power, low-noise amplifier with a negative feedback loop is provided. A low noise amplifier (LNA) includes a common gate (CG) amplifier, a common source (CS) amplifier having a gate connected to a source of the CG amplifier, a differential current balancer (DCB) connected to an output end of the CG amplifier and an output end of the CS amplifier, a symmetric load connected to the DCB, and a current bleeding circuit with one end connected to the output end of the CS amplifier and another end connected to the symmetric load, the current bleeding circuit including an active element and a load corresponding to the symmetric load, and an output end of the active element is connected to a gate of the CG amplifier.

11 Claims, 6 Drawing Sheets

(56) References Cited

U.S. PATENT DOCUMENTS

| | | | |
|---|---|---|---|
| 7,646,250 B2* | 1/2010 | Mun | H03F 3/193 |
| | | | 330/301 |
| 9,948,248 B2* | 4/2018 | Sivonen | H03F 1/56 |
| 10,361,662 B2* | 7/2019 | Kwon | H03F 1/223 |

* cited by examiner

LOW-POWER, LOW-NOISE AMPLIFIER WITH NEGATIVE FEEDBACK LOOP

BACKGROUND

1. Field of the Invention

One or more example embodiments relate to a low noise amplifier (LNA) including a negative feedback loop.

2. Description of the Related Art

With the recent development of mobile communication systems, communication devices including, for example, mobile phones and portable information terminals, are rapidly spreading. In addition, a frequency used for communication ranges widely, for example, from 800 megahertz (MHz) to 1 gigahertz (GHz), and 1.5 GHz to 5 GHz, and thus systems for transmitting and receiving signals in different frequency bands are being provided.

A receiver included in a communication device may be provided in various devices including, for example, a digital television (TV), a digital direct broadcast system, a personal digital assistant (PDA), a laptop computer, a desktop computer, a digital multimedia player, a portable or handheld game console, a video game console, a digital camera, a digital recording device, a cellular or satellite wireless phone, a radio-frequency identification (RFID), and a smartphone.

An existing low noise amplifier (LNA) included in a receiver may include, for example, a common gate (CG) LNA, a resistive feedback LNA, an inductively degenerated common source (CS) LNA, and a CG-CS balun-LNA.

The CG-CS balun-LNA may have a mismatch between a gain and a phase and also have noise, and thus may not be excellent in terms of a noise characteristic.

SUMMARY

An aspect provides a low noise amplifier (LNA) including a negative feedback loop to increase an effective transconductance, thereby having low power and low noise characteristics.

According to an aspect, there is provided an LNA including a common gate (CG) amplifier, a common source (CS) amplifier having a gate connected to a source of the CG amplifier, a differential current balancer (DCB) connected to an output end of the CG amplifier and an output end of the CS amplifier, a symmetric load connected to the DCB, and a current bleeding circuit with one end connected to the output end of the CS amplifier and another end connected to the symmetric load, the current bleeding circuit including an active element and a load corresponding to the symmetric load, wherein an output end of the active element is connected to a gate of the CG amplifier.

The DCB may include a first transistor with one end connected to the output end of the CG amplifier and another end connected to the symmetric load, and a second transistor with one end connected to the output end of the CS amplifier and another end connected to the symmetric load.

In the DCB, a source of the first transistor may be connected to a gate of the second transistor, and a source of the second transistor may be connected to a gate of the first transistor.

The DCB may further include a capacitor connected between the source of the first transistor and the gate of the second transistor, and between the source of the second transistor and the gate of the first transistor.

The load corresponding to the symmetric load may be implemented as at least one of a resistor, an inductor and a capacitor.

The active element may be implemented as a transistor, and may be connected between the CS amplifier and the load corresponding to the symmetric load.

The symmetric load may include a first load connected to the first transistor, and a second load connected to the second transistor.

An impedance of the first load may be equal to an impedance of the second load.

An impedance of the load corresponding to the symmetric load may be 1/(N−1) times the impedance of the first load and the second load.

A size ratio between the CG amplifier and the CS amplifier may be 1:N.

The LNA may further include a capacitor connected between the active element and the gate of the CG amplifier.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments will be described in detail with reference to the accompanying drawings. Various modifications may be made to the example embodiments, and accordingly the scope of the right of the patent application is not limited to the example embodiments. It should be understood to include all modifications, equivalents, and replacements within the scope of the right of the example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although terms such as "first" or "second" may be used herein to describe various components, the components are not limited by the terms. These terms are used only to distinguish one component from another component. For example, a first component may be referred to as a second component, or similarly, the second component may be referred to as the first component within the scope of the right according to the concept of the present disclosure.

Unless otherwise defined herein, all terms used herein including technical or scientific terms have the same meanings as those generally understood by one of ordinary skill in the art to which example embodiments belong. Terms defined in dictionaries generally used should be construed to have meanings matching with contextual meanings in the related art and are not to be construed as an ideal or excessively formal meaning unless otherwise defined herein.

Regarding the reference numerals assigned to the components in the drawings, it should be noted that the same components will be designated by the same reference numerals, wherever possible, even though they are shown in different drawings. Also, in describing of example embodiments, detailed description of well-known related structures or functions will be omitted when it is deemed that such description will cause ambiguous interpretation of the example embodiments.

Figure 1:
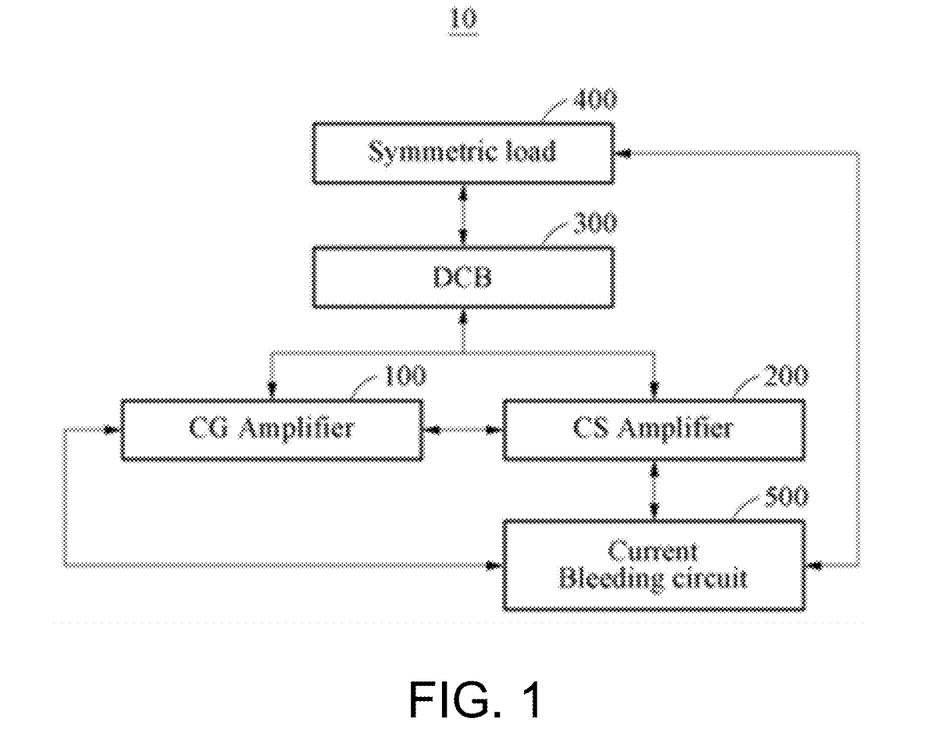
FIG. 1 is a block diagram schematically illustrating a low noise amplifier (LNA) according to an example embodiment.

FIG. 1 is a block diagram schematically illustrating a low noise amplifier (LNA) according to an example embodiment.

Referring to FIG. 1, an LNA 10 may amplify an input signal while having a low noise figure (NF). The LNA 10 may amplify the input signal while remarkably reducing power consumption.

The LNA 10 may be a balun LNA. For example, an LNA 10 may function as a balun configured to convert a single-ended signal to a differential signal, and simultaneously function as an LNA configured to amplify a signal received through an antenna at a receiving end of a radio frequency (RF) communication system while minimizing an amplification of noise.

Due to a broadband characteristic of the LNA 10, the LNA 10 may be applied to a broadband system, for example, a television (TV) tuner, a software-defined radio, and a cognitive radio.

Also, since the LNA 10 has low-power and low-noise characteristics, the LNA 10 may be applied to a wireless personal area network (WPAN), a low-power wide area network (WAN), a narrowband (NB) Internet of Things (IoT), an enhanced machine type communication (eMTC), a long range (LoRa), and a medical application.

The LNA 10 may enhance a noise characteristic or an NF. Also, the LNA 10 may enhance a balance characteristic by reducing a mismatch between a gain and a phase.

The LNA 10 may include a common-gate (CG) amplifier 100, a common-source (CS) amplifier 200, a differential current balancer (DCB) 300, a symmetric load 400, and a current bleeding circuit 500.

A gate of the CS amplifier 200 may be connected to a source of the CG amplifier 100. The DCB 300 may be connected to an output end of the CG amplifier 100 and an output end of the CS amplifier 200.

The symmetric load 400 may be connected to the DCB 300. One end of the current bleeding circuit 500 may be connected to the output end of the CS amplifier 200, and another end of the current bleeding circuit 500 may be connected to the symmetric load 400. Also, the current bleeding circuit 500 may be connected to the CG amplifier 100.

To enhance a noise characteristic in a balun LNA with a CG-CS structure, a 1:N CG-CS balun LNA may be used. Although the noise characteristic is enhanced in the above structure, an asymmetric load may be used, and accordingly a pole existing in a different frequency in nodes $V_{outp}$ and $V_{outn}$ may occur. Thus, the 1:N CG-CS balun LNA may cause a mismatch between a gain and a phase.

The mismatch between the gain and the phase may be further increased when a mismatch between a metal-oxide-semiconductor field-effect transistor (MOSFET) and a passive element of an RC, and process, voltage and temperature (PVT) variations occur.

To compensate for the mismatch, a balanced load may be used, and a structure of an amplifier to which a current bleeding transistor is added may be used. For example, when only a current bleeding transistor is added, a mismatch between a gain and a phase may be reduced, but noise of a cascode transistor and the current bleeding transistor may be added to degrade noise characteristics. The cascode transistor may be, for example, a second transistor that will be described below.

When a resistor is added to the current bleeding transistor, a degeneration effect shown in a source of the cascode transistor may increase. When a resistor is not connected to the current bleeding transistor, the degeneration effect may be $1/(N-1)g_{mC}$. When a resistor is connected to the current bleeding transistor, the degeneration effect may increase as shown in Equation 1.

$$Z_{Degen} = \frac{r_o}{N} \| \frac{1}{N-1} \frac{R_L + r_{oC}}{1 + g_{mC}r_{oC}} \qquad [\text{Equation 1}]$$

In Equation 1, $r_o$ and $r_{oC}$ denote an output impedance of the CG amplifier 100 and an output impedance of the cascode transistor, respectively, and $g_{mC}$ denotes a transconductance of the cascode transistor. When the degeneration effect increases, thermal noise of the cascode transistor generated during an output may be reduced.

In a CG-CS noise cancelling balun LNA structure, noise of the CG amplifier 100 may be completely removed in an output, and noise of the CS amplifier 200 may be reduced by increasing a transconductance of the CS amplifier 200 by N times.

In a general CG-CS noise cancelling balun LNA, there is almost no influence due to extremely low noise of a cascode transistor. In a CG-CS balun LNA to which a current bleeding circuit is added, a noise characteristic of a cascode transistor may be a main cause of an increase in output noise.

A load may be connected to the current bleeding transistor, to reduce the noise characteristic of the cascode transistor. For example, when the load is connected to the current bleeding transistor, both a symmetric load and a low-noise characteristic may exist. However, to increase a transconductance by N times, current and a size of a transistor may need to be increased by N times, which may lead to a great power consumption. Also, since an input resistance is $1/g_m$, a great current consumption may be required to match input resistances. For example, $g_m$=20 mS may need to be satisfied to match an input resistance to 50 ohms, and thus a great current consumption may be required.

The LNA 10 may reduce a current consumption by boosting a transconductance of the CG amplifier while using the symmetric load 400, and may reduce a power consumption by reducing a power voltage.

Figure 2:
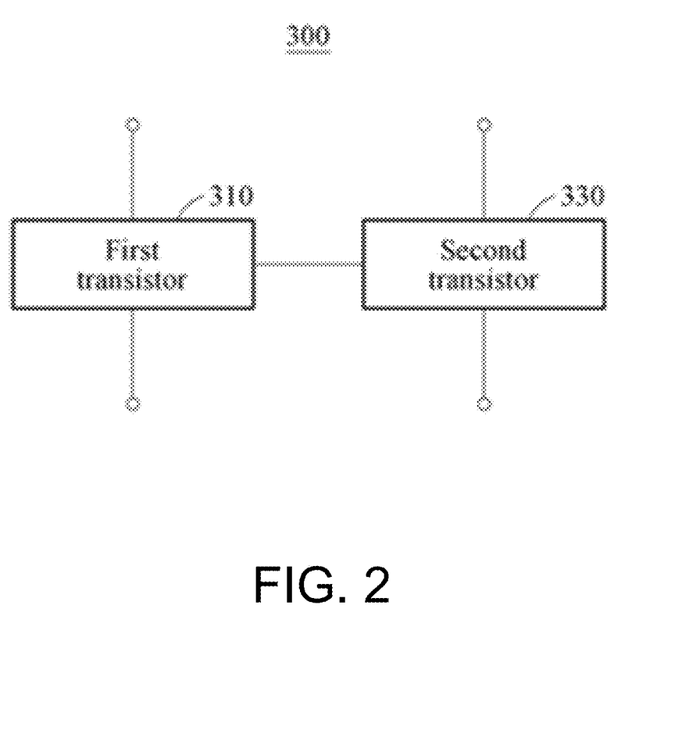
FIG. 2 is a block diagram schematically illustrating a differential current balancer (DCB) of FIG. 1.
Figure 3:
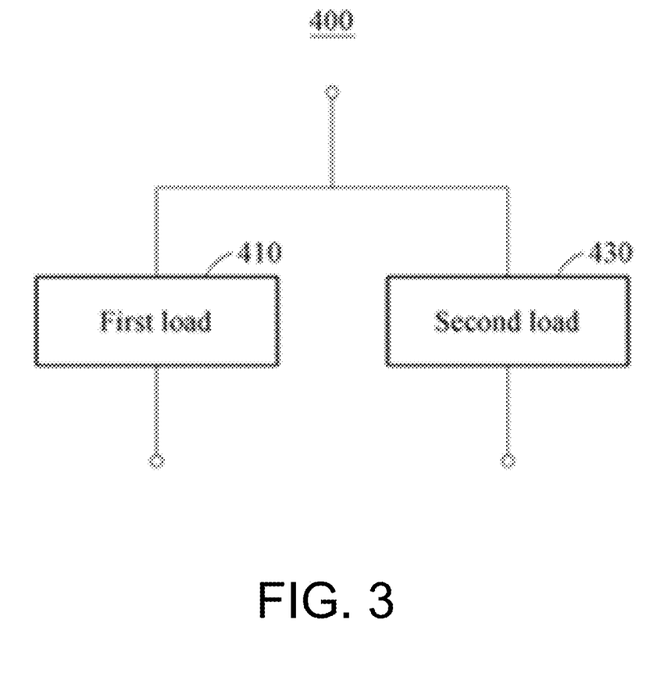
FIG. 3 is a block diagram schematically illustrating a symmetric load of FIG. 1.
Figure 4:
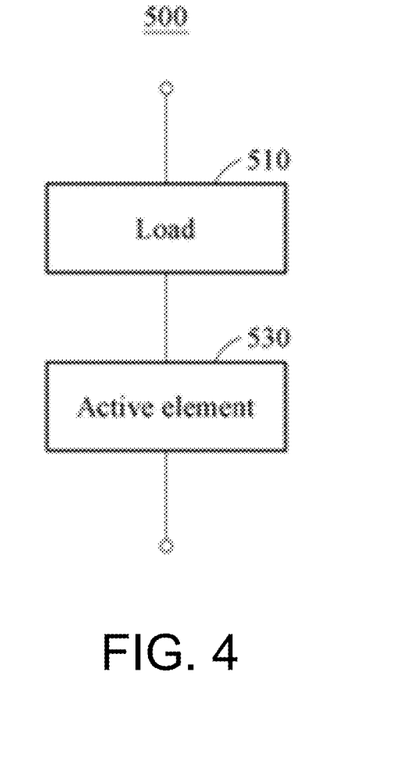
FIG. 4 is a block diagram schematically illustrating a current bleeding circuit of FIG. 1.

FIG. 2 is a block diagram schematically illustrating the DCB 300 of FIG. 1, FIG. 3 is a block diagram schematically illustrating the symmetric load 400 of FIG. 1, and FIG. 4 is a block diagram schematically illustrating the current bleeding circuit 500 of FIG. 1.

Referring to FIGS. 2 to 4, the DCB 300 may include a first transistor 310 and a second transistor 330. One end of the first transistor 310 may be connected to an output end of the CG amplifier 100, and another end of the first transistor 310 may be connected to the symmetric load 400. One end of the second transistor 330 may be connected to an output end of the CS amplifier 200, and another end of the second transistor 330 may be connected to the symmetric load 400.

A source of the first transistor 310 may be connected to a gate of the second transistor 330. A source of the second transistor 330 may be connected to a gate of the first transistor 310.

The symmetric load 400 may be electrically connected to an output end of the first transistor 310 and an output end of the second transistor 330. An electrical connection described herein may indicate a connection including a physical connection and also a connection through which an electrical signal is transferred. Thus, another component may be disposed between two components that are electrically connected.

The symmetric load 400 may include a first load 410 and a second load 430. The first load 410 may be connected to the first transistor 310, and the second load 430 may be connected to the second transistor 330. An impedance of the first load 410 may be equal to an impedance of the second load 430.

The current bleeding circuit 500 may include a load 510 and an active element 530. The load 510 may be determined to correspond to the symmetric load 400.

The symmetric load 400 and the load 510 corresponding to the symmetric load 400 may be implemented as at least one of a resistor, an inductor and a capacitor. The active element 530 may be implemented as a transistor and may be connected between the CS amplifier 200 and the symmetric load 400.

An impedance of the load 510 corresponding to the symmetric load 400 may be 1/(N−1) times an impedance of the first load 410 and the second load 430.

Figure 5A:
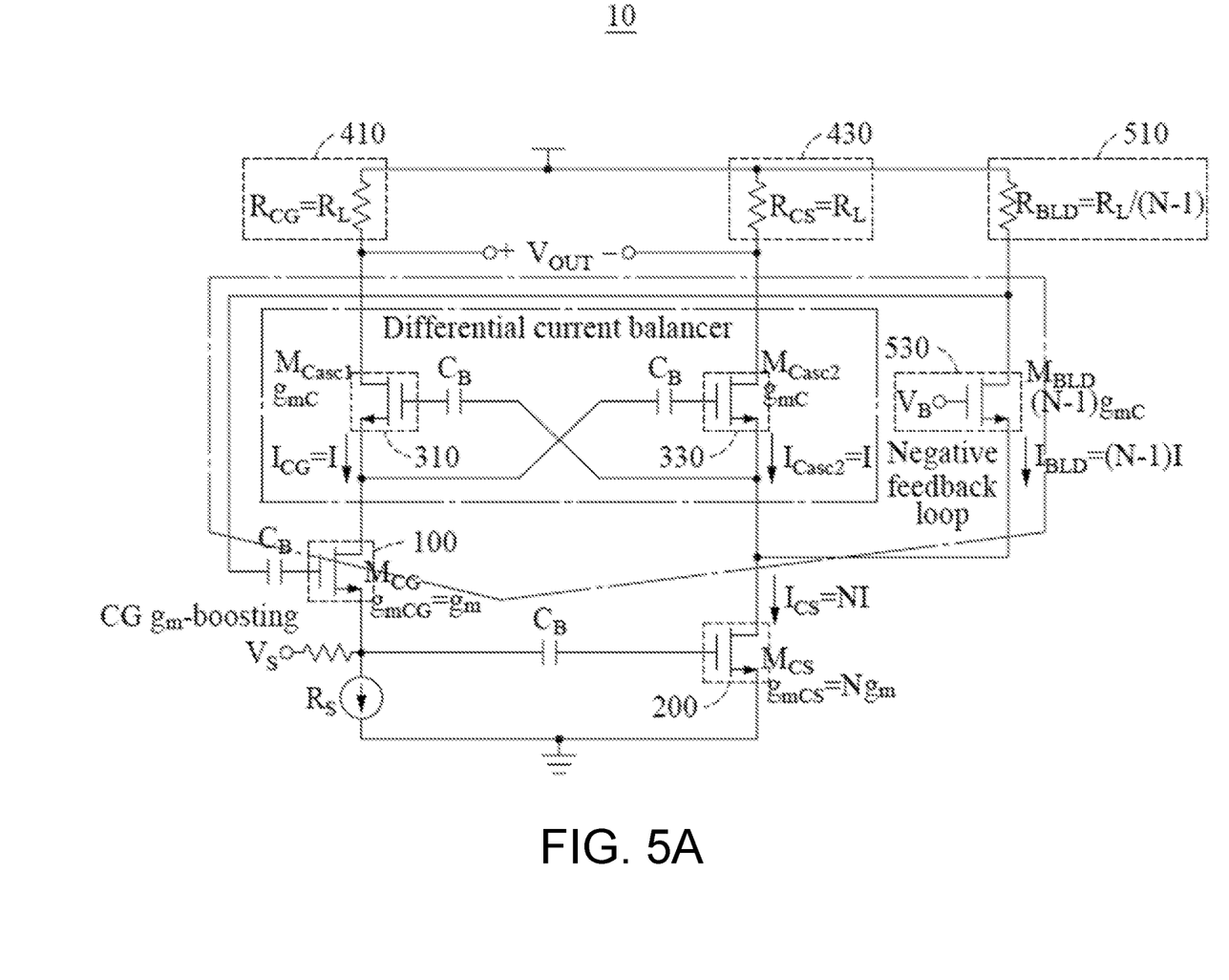
FIG. 5A illustrates an example of a circuit of the LNA of FIG. 1.

FIG. 5A illustrates an example of a circuit of the LNA 10 of FIG. 1.

Referring to FIG. 5A, the CG amplifier 100 may be connected to the source of the first transistor 310. The CG amplifier 100 may be connected in a common gate type, and may receive a single-ended signal. The CG amplifier 100 may amplify the received single-ended signal and may output a signal included in a differential signal.

The CG amplifier 100 may be implemented as a transistor. For example, the CG amplifier 100 may receive the single-ended signal through a source and may output the signal included in the differential signal through a drain.

The CS amplifier 200 may be connected to the source of the second transistor 330. The CS amplifier 200 may be connected in a common source type, and may receive a single-ended signal. The CS amplifier 200 may amplify the received single-ended signal and may output a signal included in the differential signal. In other words, the signal output from the CS amplifier 200 and the signal output from the CG amplifier 100 may constitute the differential signal.

The CS amplifier 200 may be implemented as a transistor. For example, the CS amplifier 200 may receive the single-ended signal through a gate and may output the signal included in the differential signal through a drain.

A size ratio between the CG amplifier 100 and the CS amplifier 200 may be 1:N. For example, a transconductance $Ng_m$ of the CS amplifier 200 may be N times a transconductance $g_m$ of the CG amplifier 100.

The DCB 300 may include the first transistor 310 and the second transistor 330. A capacitor CB may be connected between the source of the first transistor 310 and the gate of the second transistor 330, and another capacitor CB may be connected between the source of the second transistor 330 and the gate of the first transistor 310.

The first transistor 310 may be electrically connected between the CG amplifier 100 and the symmetric load 400. For example, the first transistor 310 may be connected to the CG amplifier 100 in a form of a cascode.

The second transistor 330 may be electrically connected between the CS amplifier 200 and the symmetric load 400. For example, the second transistor 330 may be connected to the CS amplifier 200 in a form of a cascode. For example, a second transistor may be the above-described cascode transistor.

A size of the first transistor 310 may be equal to a size of the second transistor 330. For example, a transconductance $g_{mC}$ of the first transistor 310 may be equal to a transconductance $g_{mC}$ of the second transistor 330. Thus, a current of I may flow in the first transistor 310, and a current of I may flow in the second transistor 330.

The current bleeding circuit 500 may distribute a current flowing through the CS amplifier 200. For example, the current bleeding circuit 500 may distribute the current so that a current flowing through the first transistor 310 may be equal to a current flowing through the second transistor 330.

For example, a current of NI may flow in the CS amplifier 200. The current bleeding circuit 500 may distribute a current of (N−1)I in the current of NI to the current bleeding circuit 500 so that a current of I may flow in the symmetric load 400. In other words, since a current of I flow in each of the first load 410 and the second load 430, the first load 410 and the second load 430 may be symmetrical to each other.

The current bleeding circuit 500 may include the load 510 corresponding to the symmetric load 400, and the active element 530. The load 510 corresponding to the symmetric load 400, and the active element 530 may be connected in parallel or in series. As shown in FIG. 5A, the load 510 corresponding to the symmetric load 400, and the active element 530 may be connected in series.

The load 510 corresponding to the symmetric load 400 may be implemented as a resistor, and the active element 530 may be implemented as a transistor MBLD. The active element 530 may be connected to the CS amplifier 200 in a form of a cascode. For example, a source of the active element 530 may be connected to a drain of the CS amplifier 200. A resistance value $RBLD$, of the load 510 corresponding to the symmetric load 400 may be 1/(N−1) times a resistance value $R_L$ of the first load 410. Similarly, a resistance value $R_L/(N-1)$ of the load 510 corresponding to the symmetric load 400 may be 1/(N−1) times a resistance value $R_L$ of the second load 430.

A size of the active element 530 may be greater than (N−1) times a size of the second transistor 330. For example, a transconductance $(N-1)g_{mC}$ of the active element 530 may be greater than (N−1) times the transconductance $g_{mC}$ of the second transistor 330. Thus, a current of I may flow in the second transistor 330, and a current of (N−1)I may flow in the active element 530.

The load 510 corresponding to the symmetric load 400 may remove, for example, considerably reduce, an influence of noise of the second transistor 330 that may occur in an output. For example, the noise may be thermal noise.

The gate of the CG amplifier 100 may be connected between the load 510 corresponding to the symmetric load 400 and the active element 530. Thus, a negative feedback loop of the CG amplifier 100 may be formed. A capacitor CB may be connected between the active element 530 and the CG amplifier 100.

The transconductance $g_m$ of the CG amplifier 100 may be boosted by a loop gain of the negative feedback loop. An input resistance increased in the CG amplifier 100 may be represented as shown in Equation 2 below.

$$R_{in} = \frac{1}{(1+LG)g_m} \quad \text{[Equation 2]}$$

Here, LG denotes the loop gain of the negative feedback loop.

A value of a transconductance required for input power matching of the CG amplifier 100 may be reduced by "1+LG". Due to a reduction in the value of the required transconductance, a current consumption may be reduced. When the current consumption is reduced, an IR drop of a load resistance may be reduced, and a required power voltage may also be reduced. Thus, the LNA 10 may remarkably reduce a power consumption.

Due to boosting of the transconductance $g_m$, a current output from the CG amplifier 100 may be different from a current output from the CS amplifier 200. Since the current output from the CG amplifier 100 and the current output from the CS amplifier 200 are different from each other due to the boosting of the transconductance $g_m$ of the CG amplifier 100, the DCB 300 may compensate for a problem of different loads.

The DCB 300 may equalize differential output currents. For example, the DCB 300 may maintain a gain/phase balance performance of a differential signal by symmetrically maintaining loads of an output end.

Figure 5B:
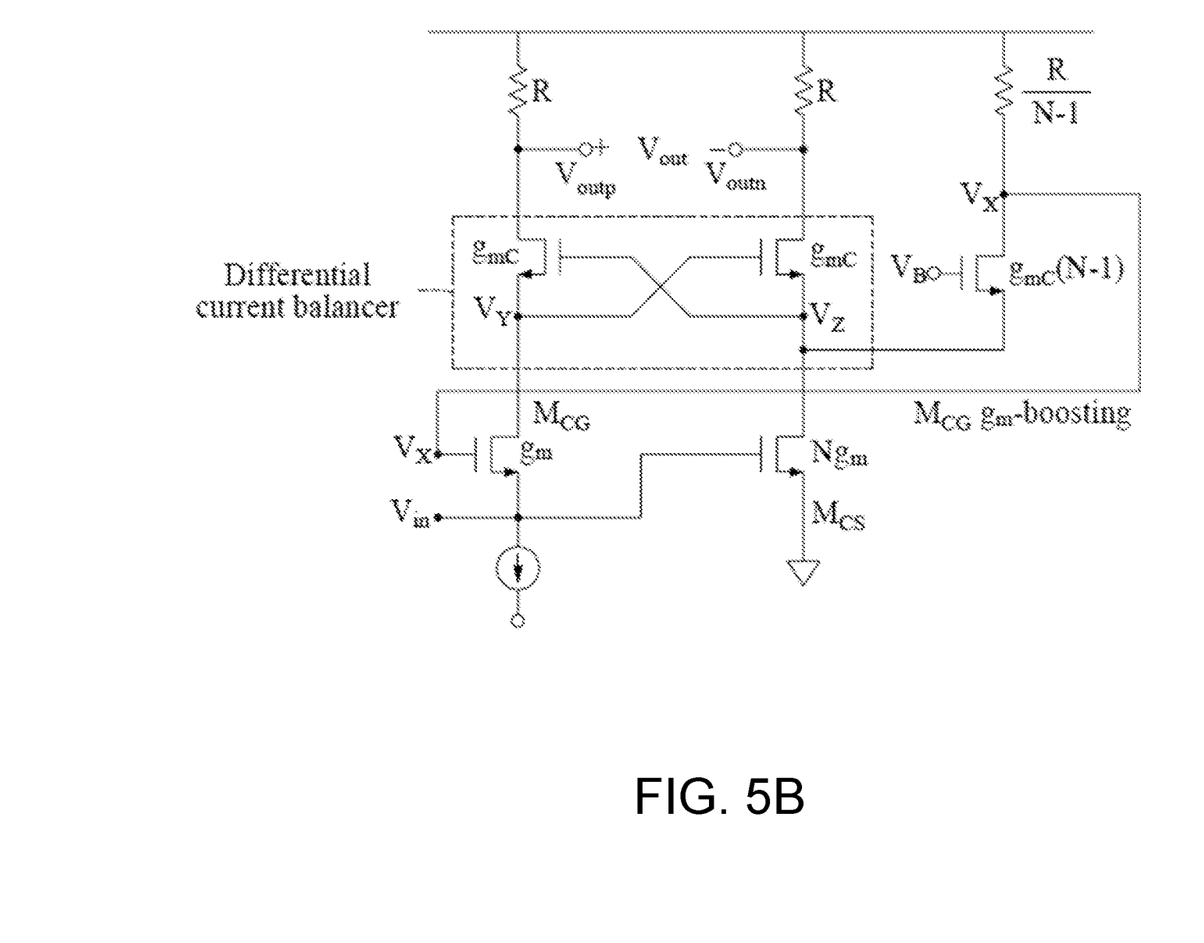
FIG. 5B illustrates an example of an equivalent circuit of the circuit of FIG. 5A.

FIG. 5B illustrates an example of an equivalent circuit of the circuit of FIG. 5A.

Referring to FIG. 5B, the transconductance $g_m$ of the CG amplifier 100 may be assumed to be equal to the transconductance $g_{mC}$ of the first transistor 310 and the second transistor 330. An alternating current (AC) capacitor may operate as if being shorted, and a channel-length modulation may be assumed to be ignored.

A Kirchhoff's Current Law (KCL) and Kirchhoff's Voltage Law (KVL) may be applied to the equivalent circuit of FIG. 5B. Solution results may be represented as shown in Equations 3 through 9. $V_X$, $V_Y$, $V_Z$, $V_{outp}$, and $V_{outn}$ may denote voltages of points shown in FIG. 5A, and $V_{out}$ may denote a voltage between the voltages $V_{outp}$ and $V_{outn}$. Also, R may denote a resistance value when a first load and a second load are resistors.

$$V_X = -\frac{(N-1)g_mR}{(N-1)+g_mR}V_{in} \quad \text{[Equation 3]}$$

-continued $$V_Y = \frac{g_mR \cdot N}{(N-1)+g_mR}V_{in} \quad \text{[Equation 4]}$$

$$V_Z = \frac{-(N-1)}{(N-1)+g_mR}V_{in} \quad \text{[Equation 5]}$$

$$V_{outp} = \frac{(N-1)+g_mR \cdot N}{(N-1)+g_mR}g_mR \cdot V_{in} \quad \text{[Equation 6]}$$

$$V_{outn} = -\frac{[(N-1)+g_mR \cdot N]}{(N-1)+g_mR}g_mR \cdot V_{in} \quad \text{[Equation 7]}$$

$$R_m = \frac{1}{g_m}\frac{1}{\frac{N \cdot g_mR+(N-1)}{(N-1)+g_mR}} = \frac{1}{g_m}\frac{1}{k} \quad \text{[Equation 8]}$$

Also, k may be represented as shown in Equation 9 below.

$$k = \frac{N \cdot g_mR+(N-1)}{(N-1)+g_mR} \quad \text{[Equation 9]}$$

In Equation 9, k has a value greater than "1" and the value may be designed to be greater than a desired value to reduce an input impedance of a CG amplifier. Thus, it may be found that an effective transconductance effective $g_m$ of the CG amplifier 100 increases by boosting of a transconductance by a negative feedback loop.

Thus, an input power matching with a less current may be performed. The LNA 10 may achieve a low noise characteristic of using a symmetric load while consuming a less current.

An asymmetry of currents due to an increase in an effective transconductance may be compensated for by using the DCB 300, and a symmetrical load may be used by using the DCB 300.

By using the symmetrical load, a gain/phase balance performance of an output differential signal may be maintained. Thus, the LNA 10 may reduce a mismatch between devices and PVT variations.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A low noise amplifier (LNA) comprising:
   a common gate (CG) amplifier;
   a common source (CS) amplifier having a gate connected to a source of the CG amplifier;
   a differential current balancer (DCB) connected to an output end of the CG amplifier and an output end of the CS amplifier;
   a symmetric load connected to the DCB; and
   a current bleeding circuit with one end connected to the output end of the CS amplifier and another end connected to the symmetric load, the current bleeding circuit comprising an active element and a load corresponding to the symmetric load, wherein an output end of the active element is connected to a gate of the CG amplifier.

2. The LNA of claim 1, wherein the DCB comprises:
   a first transistor with one end connected to the output end of the CG amplifier and another end connected to the symmetric load; and
   a second transistor with one end connected to the output end of the CS amplifier and another end connected to the symmetric load.

3. The LNA of claim 2, wherein in the DCB, a source of the first transistor is connected to a gate of the second transistor, and a source of the second transistor is connected to a gate of the first transistor.

4. The LNA of claim 3, wherein the DCB further comprises:
   a capacitor connected between the source of the first transistor and the gate of the second transistor and between the source of the second transistor and the gate of the first transistor.

5. The LNA of claim 1, wherein the load corresponding to the symmetric load is implemented as at least one of a resistor, an inductor and a capacitor.

6. The LNA of claim 1, wherein the active element is implemented as a transistor, and is connected between the CS amplifier and the load corresponding to the symmetric load.

7. The LNA of claim 2, wherein the symmetric load comprises:
   a first load connected to the first transistor; and
   a second load connected to the second transistor.

8. The LNA of claim 7, wherein an impedance of the first load is equal to an impedance of the second load.

9. The LNA of claim 7, wherein an impedance of the load corresponding to the symmetric load is $1/(N-1)$ times the impedance of the first load and the second load, wherein N is greater than one.

10. The LNA of claim 1, wherein a size ratio between the CG amplifier and the CS amplifier is 1:N, wherein N is greater than one.

11. The LNA of claim 1, further comprising:
    a capacitor connected between the active element and the gate of the CG amplifier.

* * * * *